US006780765B2

(12) United States Patent
Goldstein

(10) Patent No.: US 6,780,765 B2
(45) Date of Patent: Aug. 24, 2004

(54) INTEGRATED CIRCUIT TRENCHED FEATURES AND METHOD OF PRODUCING SAME

(76) Inventor: Avery N. Goldstein, 26336 Wyoming, Huntington Woods, MI (US) 48070

( * ) Notice: Subject to any disclaimer, the term of this patent is extended or adjusted under 35 U.S.C. 154(b) by 19 days.

(21) Appl. No.: 10/101,905

(22) Filed: Mar. 19, 2002

(65) Prior Publication Data

US 2002/0098680 A1 Jul. 25, 2002

Related U.S. Application Data

(63) Continuation-in-part of application No. 09/934,303, filed on Aug. 21, 2001, now abandoned, which is a continuation-in-part of application No. 09/373,295, filed on Aug. 12, 1999, now Pat. No. 6,277,740.
(60) Provisional application No. 60/096,616, filed on Aug. 14, 1998, now abandoned.

(51) Int. Cl.$^7$ .............................................. H01L 21/44
(52) U.S. Cl. .................. 438/660; 438/610; 438/672; 438/770
(58) Field of Search ................................ 438/660, 610, 438/661, 662, 663, 666, 672, 685, 686, 687, 700; 257/768, 769, 770, 774

(56) References Cited

U.S. PATENT DOCUMENTS

| | | | |
|---|---|---|---|
| 4,466,850 A | 8/1984 | Eichelberger et al. | ...... 156/276 |
| 4,569,876 A | 2/1986 | Nakakita | ...... 428/131 |
| 4,613,648 A | 9/1986 | Usala | ...... 524/555 |
| 4,655,864 A | 4/1987 | Rellick | ...... 156/89 |
| 4,726,991 A | 2/1988 | Hyatt et al. | ...... 428/329 |
| 4,923,739 A | 5/1990 | Jin et al. | ...... 428/221 |
| 5,073,518 A | 12/1991 | Doan et al. | ...... 437/180 |
| 5,151,168 A | 9/1992 | Gilton et al. | ...... 205/123 |
| 5,262,357 A | 11/1993 | Alivisatos et al. | ...... 437/233 |
| 5,294,567 A | 3/1994 | Dorfman et al. | ...... 437/187 |
| 5,324,553 A | 6/1994 | Ovshinsky et al. | ...... 427/571 |
| 5,453,297 A | 9/1995 | Dye et al. | ...... 427/217 |
| 5,559,057 A | 9/1996 | Goldstein | ...... 437/228 |
| 5,576,248 A | 11/1996 | Goldstein | ...... 437/225 |
| 5,624,741 A | 4/1997 | Scott | ...... 428/210 |
| 5,670,279 A | 9/1997 | Goldstein | ...... 430/5 |
| 5,728,626 A | 3/1998 | Allman et al. | ...... 438/608 |
| 5,830,538 A | 11/1998 | Gates et al. | ...... 427/535 |
| 5,925,463 A | 7/1999 | Reetz et al. | ...... 428/402 |
| 5,928,405 A | 7/1999 | Ranade et al. | ...... 75/337 |
| 5,953,629 A | 9/1999 | Imazeki et al. | ...... 438/679 |
| 5,997,958 A | 12/1999 | Sato et al. | ...... 427/468 |
| 6,277,740 B1 * | 8/2001 | Goldstein | ...... 438/660 |
| 6,319,814 B1 | 11/2001 | Tsai et al. | ...... 438/624 |

FOREIGN PATENT DOCUMENTS

| | | |
|---|---|---|
| EP | 0980094 A1 | 2/2000 |
| EP | 0980097 A1 | 2/2000 |

OTHER PUBLICATIONS

Synthesis Characterization, and Nonlinear Optical Properties of Copper Nanoparticles—H.H. Huang et al.; *Department of Chemistry, National University of Singapore*, Singapore 119260, and *Department of Physical, National University of Singapore*, Singapore 119260; Jun. 5, 1996 Langmuir 1997, 13, 175–175.

Synthesis, Characterization, and Properties of Metallic Copper Nanoparticles—N. Arul Dhas, et al.; *Department of Chemistry, Bar–Ilan University*, Ramat–Gan, 52900 Israel; Dec. 31, 1997; Chem. Mater. 1998, 10, 1446–1452.

Elongated Copper Nanoparticles Coated with a Zwitterionic Surfactant—R.A. Salkar, et al.; *Department of Chemistry, Bar –Ilan University*, Ramat Gan 52900, Israel; J. Phys. Chem. B2000, 104, 893–897.

Synthesis of Cu Nanoparticles and Microsized Fibers by Using Carbon Nanotubes as a Template; P. Chen et al.; *Physics Department, National University of Singapore*, Singapore, 119260 Oct. 6, 1998; The Journal of Physical Chemistry B, vol. 103, No. 22, Jun. 3, 1999.

Alkyl Xanthates: New Capping Agents for Metal Colloids, Capping of Platinum Nanoparticles—P. Sawant et al.; *Department of Chemistry, The Institutes for Applied Research, and the Ilse Katz Center for Meso and Nanoscale Science and Technology, Ben–Gurion University of the Negev* Beer Sheva, Israel 84105; Oct. 24, 2000 Langmuir 2001, 17, 2913–2917.

Novel One–Phase Synthesis of Thiol–Functionalized Gold, Palladium, and Iridium Nanoparticles Using Superhydride Chanel K. Yee et al.; *Department of Chemical Engineering, Chemistry and Materials Science, Polytechnic University*, Brooklyn, NY 11201; *Department of Materials Sciences and Engineering, State University of New York*, Stony Brook, NY 11794–2275, Jan. 7, 1999; Langmuir 1999, 3486–3491.

(List continued on next page.)

Primary Examiner—Kevin M. Picardat
(74) Attorney, Agent, or Firm—Gifford, Krass, Groh, Sprinkle, Anderson & Citkowski, P.C.

(57) ABSTRACT

A metal processing method is provided for growing a polycrystalline film by preferably chemical vapor deposition (CVD) from a suitable precursor gas or gases on a substrate which has been coated with seeds, preferably of nanocrystal size, of the metal material. The nanocrystal seeds serve as a template for the structure of the final polycrystalline film. The density of the seeds and the thickness of the grown polycrystalline film determine the grain size of the polycrystalline film at the surface of said film. CVD onto the seeds to produce the polycrystalline film avoids the recrystallization step generally necessary for the formation of a polycrystalline film, and thus allows for the growth of polycrystalline films at reduced temperatures.

27 Claims, No Drawings

OTHER PUBLICATIONS

Single Electron transistor using a molecularly linked gold colloidal particle chain—Toshihiko Sato; *Hitachi Cambridge Laboratory, Cavendish Laboratory*, Cambridge, UK; Haroon Ahmed, *Microelectronics Research Centre, University of Cambridge, Cavendish Laboratory*, Cambridge UK; David Brown and Brian F.G. Johnson, *University of Cambridge*, Cambridge, UK Mar. 10, 1997; J. Appl. Phys. 82(2), Jul. 15, 1997.

Scanning tunneling microscopy of ordered coated cluster layers on graphite—P.J. Durston et al.; *Nanoscale Physics Research Laboratory, School of Physics and Astronomy, The University of Birmingham*, Birmingham, UK; J.P. Wilcoxson, *Nanostructures and Advanced Materials Department; Sandia National Laboratories*, Albuquerque, NM 87185; Jul. 21, 1997; Appl. Phys. Lett. 71(20), Nov. 17, 1997.

Combinatorial approaches toward patterning nanocrystals—T. Vossmeyer et al.; *Department of Chemistry and Biochemistry, University of California*, Los Angeles, CA; X. Peng et al., *Department of Chemistry, University of California*, Berkeley, CA; J.R. Heath, *Department of Chemistry and Biochemistry, University of California*, Los Angeles, CA Apr. 7, 1998; J. Appl. Phys. 84(7), Oct. 1, 1998.

Structure of Copper Microclusters Isolated in Solid Argon—P.A. Montano et al., *Materials Science and Technology Division, Argonne National Laboratory*, Argonne, IL and W. Schulze et al., *Fritz Haber Institute der Max Planck Gesellschaft*, D–1000 Berlin, W. Germany Nov. 18, 1985; Physical Review Letters, vol. 56, No. 19 May 12, 1986.

Copper and copper compounds as coatings on polystyrene particles and as hollow spheres—N. Kawashashi et al.,*JSR Corporation, Fine Electronic Research Laboratories*, Yokkaichi–city, Japan; Jan. 28, 2000 J. Mater. Chem., 2000, 10, 2294–2297.

ω–Terminated Alkanethiolate Monolayers on Surfaces of Copper, Silver, and Gold Have Similar Wettabilities—Paul E. Laibinis et al.; *Department of Chemistry, Harvard University*, Cambridge, MA; J. Am. Chem. Soc. 1992, 114, 1990–1995.

Spectroscopic, Voltammetric, and Electrochemical Scanning Tunneling Microscopic Study of Underpotentially Deposited Cu Corrosion and Passivation with Self–Assembled Organomercaptan Monolayers—Francis P. Zamborini et al., *Department of Chemistry, Texas A&M University*, College Station, TX Aug. 11, 1997; Langmuir 1998, 14, 640–647.

Electroless Deposition of nanoscale Copper Patterns via Microphase–Separated Diblock Copolymer Templated Self–Assembly—Robert W. Zehner et al., *Searle Chemistry Laboratory, Department of Chemistry, The University of Chicago*, Chicago, IL; Jun. 16, 1999; Langmuir 1999, 15, 6139–6141.

Spin–on Cu films for ultralarge scale integrated metallization—Hirohiko Marakami et al., *Tukuba Institute for Super Materials, ULVAC, Japan, Ltd.*, Tsukuba, Ibaraki, Japan; Nobuya Imazeki et al., *Nanoparticle Division, Vacuum Metgallurgical Cp/o., Ltd.*, Sanbu–cho, Chiba, Japan; Mar. 15, 1999;J. Vac. Sci. Technol. B 17(5), Sep./Oct. 1999.

Formation and Absorption of Spectrum of Copper Nanoparticles from the Radiolytic Reduction of Cu $(CN)_2$. Arnim Henglein, *Radiation Laboratory, University of Notre Dame*, Notre Dame, IN; Aug. 20, 1999; J. Phys. Chem. B 2000, 104, 1206–1211.

Silver Nanoparticle Formation: Predictions and Verification of the Aggregative Growth Model—Dirk L. Van Hyning et al., *Department of Chemical Engineering and Department of Chemistry, University of Illinois*, Urbana, IL; Jun. 19, 2000; Langmuir 2001, 17, 3128–3135.

Synthesis of Thiol–derivatised Gold Nanoparticles in a Two–phase Liquid–Liquid System—Mathias Brust et al., *Department of Chemistry, The University of Liverpool*; Liverpool, UK Dec. 8, 1994; J. Chem. Soc., Chem. Commun., 1994.

Seed–mediated growth method to prepare cubic copper nanoparticles—Nikhil R. Jana et al., *Department of Chemistry, Indian Institute of Technology*, Kharagpur, India Jun. 12, 2000; Current Science, vol. 79, No. 9, Nov. 10, 2000.

* cited by examiner

INTEGRATED CIRCUIT TRENCHED FEATURES AND METHOD OF PRODUCING SAME

RELATED APPLICATIONS

This application is a continuation-in-part and claims the benefit of U.S. patent application Ser. No. 09/934,303 filed Aug. 21, 2001 now abandoned which is a continuation-in-part of U.S. patent application Ser. No. 09/373,295 filed Aug. 12, 1999, now U.S. Pat. No. 6,277,740, which claims the benefit of provisional patent application Serial No. 60/096,616, filed Aug. 14, 1998, and are hereby incorporated by reference.

FIELD OF THE INVENTION

The present invention relates to microelectronic trenched feature formation and more particularly to the formation of an interconnect from metal nanocrystal seeds.

BACKGROUND OF THE INVENTION

An integrated circuit requires conductive interconnects between semiconducting domains in order to communicate signals therebetween. In order to create ever faster microprocessors, smaller dimension interconnects of higher conductivity materials is an ongoing goal.

As microelectronic efficiencies have increased, interconnects have decreased in dimensional size and efforts have been made to increase the electrical conductivity of interconnect features. There is an ongoing need for ever smaller interconnects.

The rapid miniaturization of interconnects is occurring simultaneously with the transition from Al to Cu metallization for sub-0.25 $\mu$m ICs. The transition from Al to Cu has led to a change in the way interconnects are formed. While Al has been deposited as a blanket layer which is then patterned by reactive ion etching, Cu interconnects are formed by evaporative deposition into preformed (damascene) trenches and vias followed by chemical mechanical polishing (CMP).

As the interconnect width decreases and the aspect ratio increases, conventional vacuum deposition techniques approach the theoretical resolution threshold. Deep, narrow trenches and vias preferentially collect material at the damascene feature edges, leading to void formation. Electrochemical deposition (ECD) is currently the most widely used technique to fill trenches and vias with copper. However, ECD requires a seed layer. Chemical vapor depositions (CVD) and physical vapor depositions (PVD) are well-established Cu seed layer formation techniques.

Nonetheless, CVD and PVD do not inherently fill etched features preferentially over any other portion of substrate having nucleation sites. The preferential seeding of trenches with metal on which CVD or PVD deposited material can grow would yield selective deposition and lower the temperature of heating of the IC substrate during CVD or PVD to assure crystalline growth that degrades fine architecture structures on the substrate. Thus, the semiconductor industry is in need of an interconnect formation process capable of achieving higher resolution at lower temperature and ideally, at a lower cost.

The mesoscopic size regime between atoms and bulk materials is characterized by unusual properties. Mesoscopic systems exhibit collective atomic behavior, but not to a sufficient extent so as to preclude quantized effects. Many of the unusual thermodynamic and spectroscopic anomalies associated with mesoscopic systems are attributable to surface effects. Studies have shown surface energies that are 10 to 400% greater for nanocrystals than for bulk Au and Pt (C. Solliard and M. Flueli, Surf. Sci. 156, (1985), pp. 487–494) and Al (J. Wolterdorf, A. S. Nepijko and E. Pippel, Sur. Sci. 106, (1981), pp. 64–72). In the bulk, surface atoms represent such a small percentage of the total that surface effects are largely inconsequential. Surfaces generally possess modified atomic coordination numbers, geometries and diminished lattice energies relative to the bulk. The result of these modifications is that physical, spectroscopic, and thermodynamic properties, which are constant in the bulk, become size dependent variables in nanocrystals. Since a nanocrystal is a small portion of a bulk material lattice, nanocrystals are exploited in the present invention as seeds to produce thin film IC structures at low temperature.

Metallic nanocrystals have been shown to reduce melting temperatures compared with the bulk. (Ph. Buffat and J-P. Borel, Phys. Rev. A, 13, (1976), pp. 2287–2298. 2287–2298; C. J. Coombes, J. Phys., 2, (1972), pp. 441–449; J. Eckert, J. C. Holzer, C. C. Ahn, Z. Fu and W. L. Johnson, Nanostruct. Matls., 2, (1993). 407–413; C. R. M. Wronski, Brit. J. Appl. Phys. 18, (1967), pp. 1731–1737 and M. Wautelet, J. Phys. D, 24, (1991), 343–346). The depression in melting and annealing temperature is evident throughout the nanocrystal size regime, with the most dramatic effects observed in nanocrystals having a diameter from 2 to 6 nm. Melting studies on a range of nanocrystals have established that the melting temperature is size dependent in the nanometer size regime and is approximately proportional to the inverse particle radius regardless of the material identity. The size dependent melting temperature of metallic nanocrystals has included studies of Au, Pb and In, Al and Sn. (Au: Ph. Buffat and J-P. Borel, Phys. Rev. A, 13, (1976), 2287–2298. 2287–2298; Pb and In: C. J. Coombes, J. Phys., 2, (1972), 441–449; Al: J. Eckert, J. C. Holzer, C. C. Ahn, Z. Fu and W. L. Johnson, Nanostruct. Matls, 2, (1993), 407–413; and Sn: C. R. M. Wronski, Brit. J. Appl. Phys. 18, (1967), 1731–1737). The reduction in melting temperature as a function of nanocrystal size can be enormous. For example, 2 nm Au nanocrystals melt at about 300° C., as compared to 1065° C. for bulk gold. (M. Wautelet, J. Phys. D, 24, (1991), 343–346).

SUMMARY OF THE INVENTION

A method for producing a polycrystalline structure includes applying a metal in the form of nanocrystal seeds to a wafer having a trench or via cut therein. The nanocrystal seeds have a diameter between 2 and 40 nanometers. Thereafter, a substance is deposited onto the nanocrystalline seeds to form a polycrystalline structure. The presence of a nanocrystal seed functions herein as a nucleation site for crystal growth. A method for producing a microelectronic interconnect includes applying a solution comprising soluble copper nanocrystal seeds to a wafer having a trench or via cut therein have a diameter between 2 and 20 nanometers. Thereafter, copper is deposited onto the copper nanocrystal seeds to form a continuous polycrystalline copper interconnect within said trench or via.

A microelectronic structure is detailed including electrically isolated nanocrystalline domains. The domains are formed to an existing trench or via within a wafer substrate.

A method for healing a void in the film includes contacting a solution of nanocrystals dissolved in a solvent to the film and allowing the solvent to evaporate isolating the nanocrystals in the void. Thereafter, the nanocrystals are heated to fill the void with contiguous material derived from the nanocrystals wherein the void has irregular dimensions.

DETAILED DESCRIPTION OF THE INVENTION

A method is detailed herein which uses a metal nanocrystal as a CVD or PVD seed to create interconnects or electrochemical deposition seed layers therefor by conventional processes. While the present invention is not limited to a particular metal, or metallic cation-containing compound such as an oxide, nitride, phosphide, or intermetallic, it is particularly well suited for the efficient formation of copper interconnects at temperatures below 400° Celsius and even below 300° Celsius. A silicon wafer that has been patterned by lithography and etched to form a series of trenches and/or vias is the substrate for the instant invention the exposed surface of which also contains $SiO_2$. It is appreciated that an intermediate wetting layer is optionally applied to the substrate to promote interconnect wetting thereof and to prevent interdiffusion during subsequent IC processing.

A semiconductor processing method is provided for growing a polycrystalline metal film by preferably chemical vapor deposition (CVD) from a suitable precursor gas or gases on a substrate which has been coated with metal nanocrystal seeds, of the semiconductor material. The structure of the nanocrystal seeds serves as a template for the structure of the final polycrystalline film. The density of the seeds and the thickness of the grown polycrystalline film determine the grain size of the polycrystalline film at the surface of said film with more seeds, leading to small grain size. CVD onto the seeds to produce the polycrystalline film avoids the recrystallization step generally necessary for the formation of a polycrystalline film, and thus allows for the growth of polycrystalline films at reduced temperatures.

According to the present invention, polycrystalline metal film is grown on a substrate which has been previously coated with a film of metal seeds. There is no correlation between the structure of the substrate and the structure of the film. The film is preferably the result of an epitaxial CVD process on the surface of the nanocrystals, with the nanocrystal structure serving as a template for the crystal structure of said film. In addition, the density of nanocrystal seeds on the substrate surface control the final grain size of the grown polycrystalline film. The presence of the crystal seeds on the substrate also lowers the temperature for growth of a polycrystalline film. It is appreciated that a metal nanocrystal is also operative as a seed for PVD.

The nanocrystals are preferably made by a solution phase reduction from a metal salt as detailed in co-pending patent application Ser. No. 09/895,942. Other metal nanocrystal preparations are also operative including those detailed in H. Huang et al., Langmuir, 13 (1997) 172–175; I. Lisiecki and M. P. Pileni, J. Phys. Chem., 99 (14)(1995) 5077–5082; Nanoparticles and Nanostructured Films, J. H. Fendler, Wiley—VCH, 1998, Chapter 4. Alternative methods for metal nanocrystal synthesis include sputtering from a heated metal source within a vacuum chamber, as detailed in U.S. Pat. No. 5,830,538.

Upon coating a substrate with nanocrystal seeds, the substrate temperature is raised in the presence of an appropriate pressure of an appropriate gaseous organometallic to facilitate a thermal CVD process for growth onto the surface of the nanocrystal seeds or for PVD. The temperature of this process is substantially lower than would be required to grow a polycrystalline film on the substrate in the absence of the nanocrystal seeds.

A metal nanocrystal that has been solvent stabilized by a volatile surface passivating agent is applied to the substrate by a variety of conventional liquid deposition techniques illustratively including dip coating, spray coating, spin coating, and electrochemical deposition. As the nanocrystal solvent evaporates, metal nanocrystals are selectively stranded on the substrate. Preferably, the passivating agent is an organic molecule bonding to the metal through an oxygen, nitrogen or sulfur atom. The liquid chosen to volatilize and leave a bare metal nanocrystal surface having zero-oxidation state metal atoms thereon. Heating to a temperature of about 150° C. to 250° C. is sufficient to volatilize the passivating agent. Heating to 150° C. to 250° C. in order to volatilize the nanocrystal passivating agent is appreciated to often be sufficient to sinter the metal nanocrystal depending on nanocrystal domain size and the identity of the metal. Additional heating to a metal nanocrystal size-dependent melting temperature is optionally performed to provide a metal nucleation seed for CVD or PVD deposition that has thermodynamically reoriented relative to the substrate.

It is appreciated that metal salts also optionally serve as sources of metal nanocrystals by conventional liquid deposition techniques provided the salt is reduced by exposure to hydrogen gas or other reductant at a temperature below 400° C. Optionally, a solution or dispersion of organometallics is applied by liquid deposition techniques. A particularly preferred organometallic is a metal hydrazine carboxylate that upon heating forms gaseous byproducts and a metal crystallite where the metal has a reduction potential of less than 0.9 eV.

The present invention identifies significant cost efficiencies based on the deposition characteristics of nanocrystal-based construction of electronic devices. The nanocrystal solutions or suspensions are applied by drip, spray or spin coating onto a trenched integrated circuit (IC) wafer. Unlike chemical and physical vapor deposition techniques, the present invention selectively deposits nanocrystal particulate in the IC trenches by taking advantage of the slower volatilization of a solvent carrier from trenches, causing the nanocrystals to congregate in high aspect ratio features. As a result, the quantity of extraneous deposition material, which must be removed by CMP, is diminished. Lastly, an environmental benefit results from pre-selecting aqueous and or benign organic solvents the nanocrystal solution, in place of solvents currently used in the chip manufacturing process.

Since evaporation of a solution of solubilizing metal nanocrystals or the sedimentation of solvent dispersed metal nanocrystals selectively isolates metal nanocrystals into trenched regions of a substrate, preferential to isolate on substrate plateaus subsequent CVD deposition occurs preferentially in substrate trenches. This aspect of the present invention affords trench or via selective CVD.

The inventive soluble metal nanocrystals are optionally applied to an existing metal layer in order to heal defects therein. Defect pores or voids in a metal layer formed by conventional techniques is preferably healed by evaporating a metal nanocrystal solution onto the defects thereby isolating the nanocrystals. With the nanocrystals able to penetrate any feature penetrable by solvent molecules, metal nanocrystals remain in such a feature upon solvent evaporation. The nanocrystals are applied to a metal layer formed by CVD, PVD or ECD. A solubilized metal nanocrystal optionally includes ligands imparting mobility to the nanocrystal in an electric field thereby allowing a nanocrystal to migrate in an electric field. As such, the inventive soluble nanocrystals are operative as an additive to an electrochemical deposition bath.

In electrochemical baths, a metal nanocrystal surface is derivatized with a passivating liquid making the nanocrystal soluble in aqueous, alcoholic or other organic solvent. Such a solution is operative as an electrophoretic deposition bath where the substrate functions as an electrode of the attractive polarity relative to the nanocrystal with a polar ligand terminus imparting polar solvent solubility and a change per unit area of nanocrystal surface.

The present invention also identifies cost savings associated with production defects. Nanocrystal deposition of interconnects is both reversible and repairable. Poor deposition technique is corrected by resolubilizing nanocrystals stranded on a trenched IC substrate by solvent washing prior to sintering the nanocrystals. Further, trench regions showing incomplete filling or separation from the trench walls can be remedied after sintering or melting to form bulk material interconnect features through the reapplication of a nanocrystal solution. Because the solvent containing the nanocrystals can freely penetrate fissures and voids associated with an IC patterned for an interconnect, additional nanocrystals are deposited into poorly filled regions.

A nanocrystal solution is applied to flood the wafer surface. The solvent penetrates the trench recesses within the wafer surface, including those shadowed or otherwise obscured from evaporative methods. In the process nanocrystals dissolved or suspended in the solution are carried into these regions. The solvent volatilizes more quickly from the wafer plateaus as compared to the recesses causing the nanocrystals to become concentrated in the shrinking solvent pools within the recesses. The nanocrystals become stranded in the drying trenches. Heating the wafer to a temperature sufficient to sinter or melt contiguous nanocrystals results in the formation of bulk polycrystalline domains.

In the case of many technologically important interconnect materials such as copper, the intermediate layer is illustratively a layer of TiN or TaN having a sufficient thickness to assure continuity. Other such intermediate layers are formed by evaporation of a base metal layer onto the trenched substrate and thereafter exposing the base metal layer to a nitrogen plasma to induce a surface nitriding as is conventional to the art.

A solution of dissolved or suspended nanocrystals is applied to the contoured surface of the wafer. Preferably, the nanocrystal solution or suspension is concentrated to facilitate a desired metal nanocrystal seed density on the substrate.

The solvent utilized to form the solution is optionally aqueous or organic. The solvent is chosen based on factors including, but not limited to hydrophilicity of the wafer surface, solubility of the nanocrystals therein, vapor pressure, toxicity, purity and the like.

The nanocrystal is defined as a particle having a linear dimension in any direction on the order of nanometers, namely 1 to 100 nm in diameter. Preferably, the nanocrystal of the present invention is between 2 and 20 nm. More preferably, the nanocrystal of the present invention is between 2 and 10 nm. The size distribution of the nanocrystals in solution is of some importance, since the sintering temperature of particles in this size regime is size dependent. Likewise, the melting temperature is size dependent. Preferably, a size distribution of less than 30% of the average particle diameter is used for nanocrystals of an average diameter of less than about 6 nm with increasingly greater tolerances being preferred as the average particle increases beyond 6 nm. The nanocrystals are optionally either dispersed in a solvent by conventional means illustratively including sonication, agitation, solution shearing and the like; or the nanocrystal surface is coupled to a passivating agent by adsorption or chemically bonding thereto. The passivating agent preferably being soluble in the solvent and thus imparting solubility to the particles. Preferably, the nanocrystals are soluble to promote segregation into low volatilization rate, trench and via regions, as compared to wafer plateaus. More preferably, the nanocrystals are copper for the formation of an interconnect.

The passivating agent is introduced to prevent nanocrystal growth beyond a pre-selected size and preferably to also impart solubility on the nanocrystal in a solvent. The passivating agent illustratively includes a variety of thermally volatile organics including those of the formula XRY where X is a moiety capable of chemically bonding to a surface atom of the nanocrystal and illustratively includes alcohol, amine, carboxylate, ketone, thiol, imide, amide, sulfonyl, nitryl, aldehyde, and phosphorus containing moeities; R is $C_1$–$C_{30}$ aliphatic, aryl or heteroatom substituted derivative thereof and Y is X or hydrogen. The RY portion of the passivating agent is optionally chosen to interact with the solvent to impart solubility. In another embodiment, Y bonds to the surface of a second nanocrystal to tether nanocrystals together. Further, dendritic or polymeric variants of XRY are operative to form an extended matrix of nanocrystals. Preferably, the passivating agent is a linear $C_2$–$C_{24}$ alkanethiol, -amine, -carboxylate, nitrogen- or phosphorus-containing moiety. The nanocrystal surface binding passivating agent moiety being dictated by established organometallic chemistry.

Nanocrystals are applied to the wafer by applying the solution thereto. Layering a solution of the instant invention onto a wafer is operative. Preferably, the solution is applied in such a way as to promote uniform deposition of the nanocrystals across whole wafers, such methods illustratively include atomizing the solution and applying as a fine nanocrystal paint spray; and spin coating the solution onto a rotating wafer. Optionally, a binder is dispersed in the solution to minimize particle movement as the solvent pool evaporates. A binder useful in the present invention includes low molecular weight and polymeric organic substances. The binder being chosen such that upon heating to a temperature of less than about 250 to 300° Celsius, the binder is volatilized. The binder is chosen to minimize binder residues, the residues likely to decrease conductivity of the bulk domain resulting from heating the nanocrystals. Binders illustratively include waxes; aliphatic compounds containing at least eight carbon atoms including carboxylic acids alcohols, aldehydes, amines, thiols and salt thereof wherein the cation is a conductive metal ion illustratively including copper aluminum, magnesium, gold, silver, manganese, molybdenum and the like; polymeric materials which volatilize to greater than 95% by weight below 250° Celsius including poly (acrylic acid), polyglycols, polycarbonates, polyalkyls, polyalcohols, polyesters and the like; proteinaceans substrates such as albumin, gelatin and collagen; carbohydrates; and organosilanes.

The nanocrystal seeds of the instant invention are composed of any material that is conventionally used to create interconnect structures, intermediate layers or barrier structures in microelectronics. These materials illustratively include: aluminum, copper, gold, manganese, molybdenum, nickel, palladium, platinum, tin, zinc, tantalum, titanium and silver, alloys, oxides, nitrides and phosphides thereof. Further, in instances where one wishes to create a metal-oxide-semiconductor (MOS) junction intermediate or barrier structures, nanocrystals of the metallic elements may be deposited and oxidized to positive oxidation state greater than zero by heating to a temperature of less than 500° Celsius or subjecting the metal to a gaseous plasma in an atmosphere of the gaseous oxidant. The metallic elements being oxidized to form a variety of metal compounds including oxides, nitrides, and phosphides. Alternately, nanocrystals of the oxides are synthesized and stranded directly into IC wafer trenches and vias to serve as deposition seeds. It is appreciated that upon heating metallic nanocrystals in order to form conductive structures, it may be necessary to perform such heating under an inert or reducing atmosphere to prevent unwanted oxidation.

There are several temperature ranges important to the process of an operative IC structure using nanocrystal seeds. In a preferred embodiment, the nanocrystal surface is coated with a passivating agent that imparts solvent solubility to the nanocrystal. Upon heating a nanocrystal coated wafer above the passivating agent thermalization temperature, the passivating agent is volatilized allowing clean nanocrystal surfaces of contiguous nanocrystals into contact and to act as deposition seeds. While the passivating agent volatilization temperature is largely size independent and related to the chemisorption or physisorption energy between the passivating agent and the nanocrystal surface atoms, nanocrystal sintering and melting temperature are controllable over hundreds of degrees Celsius through nanocrystal size domain selection. The PVD or CVD temperature onto nanocrystal seeds is lower than the same process absent the inventive seeds, preferably, greater than 50° C. less than the process absent salt seeds.

It is appreciated that the inventive process is operative with supercritical fluid deposition, such as supercritical deposition of copper of material, where the nanocrystal seeds promote trench selective deposition although not necessarily at a different process temperature. Sintering is defined as the interfacial coalescence of contiguous particles while the particle cores retain prior crystalline properties. Sintering temperature is calculable or approximated as two-thirds of the substance melting temperature in degrees Kelvin. Further, heating beyond the sintering temperature brings the nanocrystals to a size dependent melting temperature. Melting of a contiguous matrix of nanocrystals results in a densified polycrystalline bulk structure.

The present invention is capable of overcoming prior art limitations regarding dimensional shrinkage associated with densification, thin film instability through repetitive nanocrystal solution application. (K. T. Miller et al. J. Mater Res. 5 (1990) 151–160; B. A. Korgel and D. Fitzmaurice Phys. Rev. Let 80 (1998) 3531–3534; A. G. Evans et al. J. Mater Res. 3 (1988) 1043–1049).

Significant shrinkage is associated with passivating agent volatilization, thus after applying a nanocrystal solution to a wafer, the wafer is heated to the passivating agent volatilization temperature and additional nanocrystal solution optionally are applied to fill feature voids associated with volatilization. This process is optionally repeated prior to raising the wafer to a sintering of melting temperature for the nanocrystal mass filling a wafer trench or via. It is appreciated that nanocrystal deposition is optionally carried out at a temperature above the passivating agent volatilization temperature such that active nanocrystal surfaces are formed upon contact with a trenched wafer.

The relevant volatilization, sintering, and melting temperatures for a given nanocrystal solution are determinable through thermal analysis, techniques such as differential scanning calorimetry (DSC), thermal gravimetric analysis (TGA), temperature dependent spectroscopies and conductivity.

In instances where the interconnect is being deposited onto a silicon oxide surface other factors need to be considered. Metals often poorly wet oxide surfaces and thus an intermediate conventional adhesion-promoting layer is applied. In those instances where a hydrophobic solvent is used to coat a hydrophilic oxide surface, the solvent can be induced to wet the oxide surface by washing the wafer surface with a silanol or similar surfactant prior to deposition of the particle containing solvent. The silanol wash creates a thin layer that projects organic functionalities away from the surface which attractively interact with the particle surfaces of hydrophobic particles and simultaneously bonds to the oxide surface through the hydroxyl functionality. It is appreciated that other adhesion promoters known to the art of laminating non-wettable oxide and metallic layers are operative herein under the disclosed thermal conditions.

Having described the inventions, the following illustrative examples are provided which are not intended to limit the scope of the invention.

EXAMPLE 1

A solution of 3 nm gold nanocrystals passivated with dodecanethiol are synthesized using the method of Leff et al., J. Phys. Chem. 99, (1995) 7036. The gold particles are redissolved in toluene and the toluene solution pipetted onto a trenched silicon wafer having a silicon dioxide surface and a 50 nm layer of TiN over 100 nm of Ti and trench widths of from 5 microns to 0.2 microns. The solution is reddish-black in color and leaves a black film on the wafer following solvent evaporation. The wafer is then allowed to air dry and then heated in air for 2 hours at 300° Celsius. Upon heating the black film of gold nanocrystals takes on a metallic yellowish hue of bulk gold. The surface shows no traces the dodecanethiol passivating agent as determined by X-ray Photospectroscopy (XPS). The gold is observed to be preferentially deposited in the trenches, as compared to the wafer upper surface.

EXAMPLE 2

The procedure of Example 1 is repeated with the particles dissolved in hexane in place of toluene, with similar results.

EXAMPLE 3

The nanocrystals of Example 1 are spun coated at 300 rpm onto a rotating trenched wafer. Upon light reflectance associated with the wafer trench pattern being obscured by the black nanocrystal deposits thereon, the wafer is heated to 150° Celsius for 20 minutes. Greater than 99.9% of the dodecanethiol is observed to volatilize according to TGA. Additional nanocrystal solution is applied to the wafer. Following drying, the wafer is heated to 300° Celsius resulting in complete filling of the wafer trenches with bulk gold features. Few isolated gold domains are observed on the wafer plateau.

EXAMPLE 4

The procedure of Example 3 is repeated after dissolving one part by weight of paraffin in the nanocrystal solution per 50 parts toluene. The solution is atomized onto the wafer and allowed to dry. Upon heating as above, a more uniform distribution of particles across the wafer plateau and trenches is noted.

EXAMPLE 5

The procedure of Example 3 is repeated with copper nanocrystals made by a preparation analogous to Leff et al. with copper (II) chloride used in place of hydrogen tetrachloroaurate and the amine substituted for the thiol. The particles are synthesized in batches having average sizes ranging from 1.5 to 6 nm by adjusting the molar ratio to passivating molecule to copper. The copper particles are heated in a reducing atmosphere of 10% hydrogen and 90% nitrogen at 300° Celsius for 2 hours. A metallic sheen characteristic of bulk copper is observed.

EXAMPLE 6

Copper nanocrystals and silver nanocrystal of 3 and 3.5 nm, respectively, are made as per A. Manna et al., Chem. Mater 9 (1997), 3032–3036. The nanocrystals are mixed with 3 nm Au nanocrystals to a Au:Cu:Ag total weight ratio of 7:78:15 and dissolved in hexane. The nanocrystal is spray coated using a paint sprayer onto a trenched wafer, prior to heating to 350° Celsius. The wafer features are wholly filled with metal having a resistivity consistent with literature values.

EXAMPLE 7

The procedure of Example 3 is repeated with the nanocrystal solution applied to a wafer heated to 150° Celsius. Following solution application, the wafer is heated to 350° Celsius to yield a bulk gold interconnects in the wafer trenches.

EXAMPLE 8

The procedure of Example 7 is repeated with the nanocrystal solution applied to a wafer at 350° Celsius. Bulk gold is observed coating the plateau and trenches uniformly.

It is appreciated that various modification of the present invention in addition to those shown and described herein will be apparent to those skilled in the art from the above description. Such modifications are also intended to fall within the scope of the appended claims.

All references cited herein are intended to be incorporated by reference to the same extent as if each was individually and explicitly incorporated by reference.

What is claimed is:

1. A method for producing a polycrystalline structure comprising:
    applying a metal in the form of nanocrystal seeds to a wafer having a trench or via cut therein, said seeds have a diameter of between 2 and 40 nanometers; and
    depositing a substance onto said nanocrystal seeds to form the polycrystalline structure.
2. The method of claim 1 wherein said nanocrystal seeds are composed of a material selected from the group consisting of: aluminum, copper, gold, silver, manganese, molybdenum, nickel, palladium, platinum, tin, zinc, tantalum, titanium, alloys, oxides, nitrides and phosphides thereof.
3. The method of claim 1 wherein said nanocrystal seeds dissolved in said solvent.
4. The method of claim 1 wherein said deposition substance is a metal.
5. The method of claim 1 wherein said deposition substance is a copper.
6. The method of claim 4 wherein said substance and said nanocrystal seeds comprise the same metal.
7. The method of claim 1 wherein said nanocrystals are copper.
8. The method of claim 1 wherein said polycrystalline domain comprises sintered nanocrystals.
9. The method of claim 1 wherein said nanocrystal seeds further comprise a surface passivating agent.
10. The method of claim 1 wherein said polycrystalline domain comprises melted nanocrystals.
11. The method of claim 9 further comprising the step of:
    heating said seeds so as to volatilize said passivating agent.
12. The method of claim 8 wherein said seeds are heated to less than 350° Celsius.
13. The method of claim 1 wherein deposition of a substance is by a technique selected from the group consisting of:
    chemical vapor deposition, physical vapor deposition, electrochemical deposition, and supercritical fluid deposition.
14. The method of claim 2 wherein a layer is an intermediate between said wafer and said nanocrystal seeds, said layer is selected from the group consisting of titanium, titanium nitride, tantalum and tantalum nitride.
15. The method of claim 1 wherein said deposition substance is deposited by chemical vapor deposition.
16. The method of claim 15 wherein chemical vapor deposition occurs at a lower temperature than a chemical vapor deposition absent said seeds.
17. A method of producing a microelectronic interconnect comprising:
    applying a solution comprising soluble copper nanocrystal seeds to a wafer having a trench or via cut therein, said copper nanocrystal seeds have a diameter of between 2 nm and 20 nm; and
    depositing copper onto said copper nanocrystal seeds to form a continuous polycrystalline copper interconnect within said trench or via.
18. The method of claim 14 wherein applying said solution involves spin coating.
19. The method of claim 14 wherein applying said solution involves spray coating.
20. A microelectronic structure comprising:
    isolated nanocrystalline domains formed to an existing trench or via within a wafer substrate.
21. The structure of claim 17 wherein said domains having dimension of 2 to 20 nanometers.
22. The structure of claim 17 wherein said domains comprise an element or compound selected from the group consisting of: aluminum, copper, gold, manganese, molybdenum, nickel, palladium, platinum, tin, zinc, tantalum, titanium and silver, alloys, oxides, nitrides and phosphides thereof.
23. The structure of claim 17 wherein said domains comprise copper.
24. A method for healing a void in a film comprising:
    contacting a solution comprising a plurality of nanocrystals and a solvent to the film;
    allowing said solvent to evaporate, isolating said plurality of nanocrystals in the void;
    heating said plurality of nanocrystals to fill said void with contiguous material deriving from said plurality of nanocrystals wherein the void has irregular dimensions.
25. The method of claim 22 wherein said solution is contacted under the influence of an electric field.
26. The method of claim 22 wherein said film and said plurality of nanocrystals comprise the same metal.
27. The method of claim 22 wherein said film and said plurality of nanocrystals comprise copper.

* * * * *